United States Patent [19]

Larson et al.

[11] Patent Number: 4,874,669

[45] Date of Patent: Oct. 17, 1989

[54] CURABLE COMPOSITIONS CONTAINING AN EPOXY RESIN, A DIFUNCTIONAL PHENOL AND A POLYFUNCTIONAL PHENOL

[75] Inventors: Paul A. Larson; Dale J. Aldrich, both of Lake Jackson; Jody R. Berman, West Columbia, all of Tex.

[73] Assignee: The Dow Chemical Company, Midland, Mich.

[21] Appl. No.: 232,414

[22] Filed: Aug. 15, 1988

[51] Int. Cl.$^4$ ............... C08G 59/08; C08G 59/32; C08L 63/04

[52] U.S. Cl. ............... 428/416; 523/454; 525/481; 525/501; 525/523; 528/89; 528/90; 528/91; 528/93; 528/98; 528/94; 528/104; 428/415

[58] Field of Search ........... 525/481, 501, 523; 528/89, 90, 91, 93, 94, 98, 104; 523/454; 428/415, 416

[56] References Cited

U.S. PATENT DOCUMENTS

| | | | |
|---|---|---|---|
| 3,264,369 | 8/1966 | Ephraim | 260/831 |
| 3,383,433 | 5/1968 | Salensky | 260/831 |
| 3,493,630 | 2/1970 | Salensky | 260/831 |
| 3,687,894 | 9/1972 | Collings et al. | 260/47 EC |
| 3,738,862 | 6/1973 | Klarquist et al. | 117/126 GE |
| 3,931,109 | 1/1976 | Martin | 260/47 EP |
| 4,322,456 | 3/1982 | Martin | 427/195 |
| 4,343,731 | 8/1982 | Pucci et al. | 523/427 |
| 4,368,299 | 1/1983 | Watanabe et al. | 525/481 |
| 4,440,914 | 4/1984 | Helfand et al. | 525/482 |
| 4,552,814 | 11/1985 | Cavitt et al. | 528/98 X |
| 4,604,317 | 8/1986 | Berman et al. | 428/285 |
| 4,684,700 | 8/1987 | Wang et al. | 525/481 |

FOREIGN PATENT DOCUMENTS

| | | |
|---|---|---|
| 58-19322 | 2/1983 | Japan . |
| 61-148226 | 7/1986 | Japan . |
| 61-148228 | 7/1986 | Japan . |
| 61-246228 | 11/1986 | Japan . |

OTHER PUBLICATIONS

Derwent Abstract 86-235231/36-Jap. 61/163,925, Matsushita Electric Works.
Derwent Abstract 87-068076/10-Jap. 62/020,519, Matsushita Electric Works.
Derwent Abstract 86-031993/05-Jap. 60/252,620, Mitsubishi Gas Chemicals.

*Primary Examiner*—Earl Nielsen

[57] ABSTRACT

Electrical laminates are prepared from prepreg materials prepared by impregnating a substrate with a laminating varnish comprising a ketone solvent solution of a curable composition comprising (A) at least one aromatic based epoxy resin having an average number of epoxide groups per molecule of more than 2; (B) a mixture of (1) at least one phenolic hydroxyl-containing compound having an average of more than 1 but not more than 2 phenolic hydroxyl groups per molecule; and (2) at least one phenolic hydroxyl-containing compound having an average of more than 2 phenolic hydroxyl groups per molecule; and (C), optionally, at least one catalyst for effecting the reaction between (A) and (B).

44 Claims, No Drawings

CURABLE COMPOSITIONS CONTAINING AN EPOXY RESIN, A DIFUNCTIONAL PHENOL AND A POLYFUNCTIONAL PHENOL

FIELD OF THE INVENTION

The present invention concerns curable compositions containing an epoxy resin, difunctional phenols and polyfunctional phenols as well as cured products thereof. The invention also concerns a curing agent composition for epoxy resin comprising a mixture of difunctional phenols and polyfunctional phenols.

BACKGROUND OF THE INVENTION

Electrical laminates are usually prepared from bisphenol A based epoxy resins advanced with tetrabromobisphenol A and cured with a biguanide such as dicyandiamide. These electrical laminates usually require curing at 350° F. for about an hour to obtain an adequate cure. It would be desirable to obtain an adequate cure. It would be desirable to have laminates which are cured in much less time e.g. within about ten minutes without a substantial loss in its physical properties.

SUMMARY OF THE INVENTION

One aspect of the present invention pertains to a composition which comprises
(A) at least one aromatic based epoxy resin having an average number of epoxide groups per molecule of more than 2; and
(B) a phenolic hydroxyl-containing component consisting essentially of
  (1) at least one phenolic hydroxyl-containing compound having an average of more than 1 but not more than 2 phenolic hydroxyl groups per molecule; and
  (2) at least one phenolic hydroxyl-containing compound having an average of more than 2 phenolic hydroxyl groups per molecule;
(C) optionally, at least one ketone solvent as the only solvent for components (A) and (B); and
(D) optionally, one or more stabilizers; and
wherein components (A) and (B) are present in quantities which provide a ratio of phenolic hydroxyl groups for each epoxy group of from about 0.75:1 to about 1.5:1; component (B1) is present in an amount which provides a ratio of phenolic hydroxyl groups per epoxide group contained in component A of from about 0.1:1 to about 0.65:1; component (C) is present in an amount of from about zero to about 75 weight percent based upon the combined weight of components (A), (B), (C) and (D); and component (D) is present in an amount of from about 0.05 to about 1 percent by weight based upon the weight of component (A).

Another aspect of the present invention pertains to a curable composition which comprises
(A) at least one aromatic based epoxy resin having an average number of epoxide groups per molecule of more than 2; (B) a phenolic hydroxyl-containing component consisting essentially of
  (1) at least one phenolic hydroxyl-containing compound having an average of more than 1 but not more than 2 phenolic hydroxyl groups per molecule; and
  (2) at least one phenolic hydroxyl-containing compound having an average of more than 2 phenolic hydroxyl groups per molecule;
(C) optionally, at least one ketone solvent for component (A) as the only solvent in the composition except for minor amounts of any solvent for component (C);
(D) optionally, one or more stabilizers; and
(E) a catalytic quantity of at least one catalyst for effecting the reaction between components (A) and (B); and
wherein components (A) and (B) are present in quantities which provide a ratio of phenolic hydroxyl groups for each epoxy group of from about 0.75:1 to about 1.5:1; component (B1) is present in an amount which provides a ratio of phenolic hydroxyl groups per epoxide group contained in component A of from about 0.1:1 to about 0.65:1; component (C) is present in an amount of from about zero to about 75 weight percent based upon the combined weight of components (A), (B), (C), (D), and (E); component (D) is present in an amount of from about zero to about 1 percent by weight based upon the weight of component (A) and component (E) is present in an amount of from about 0.00005 to about 0.01 mole of catalyst per 100 parts by weight of the combined weight of the epoxy-containing component and the phenolic hydroxyl-containing component.

Another aspect of the present invention pertains to an improvement in a laminating varnish comprising (A) an epoxy resin component, (B) a curing agent for said epoxy resin and (C) a solvent; wherein the improvement resides in employing as the epoxy resin component (A) at least one aromatic based epoxy resin having an average number of epoxide groups per molecule of more than 2; said curing agent component (B) is a phenolic hydroxyl-containing composition consisting essentially of a mixture of (1) at least one phenolic hydroxyl-containing compound having an average of more than 1 but not more than 2 phenolic hydroxyl groups per molecule; and (2) at least one phenolic hydroxyl-containing compound having an average of more than 2 phenolic hydroxyl groups per molecule; as the solvent component (C), at least one ketone solvent as the only solvent present in the composition except for minor amount, of any solvent for component (D); and optionally, (D) a catalytic quantity of at least one catalyst for effecting the reaction between components (A) and (B); and wherein components (A) and (B) are present in quantities which provide a ratio of phenolic hydroxyl groups for each epoxy group of from about 0.75:1 to about 1.2:1; component (B1) is present in an amount which provides a ratio of phenolic hydroxyl groups per epoxide group contained in component A of from about 0.1:1 to about 0.65:1; and component (C) is present in an amount of from about 5 to about 75 weight percent based upon the combined weight of the laminating varnish composition.

Another aspect of the present invention pertains to a laminate resulting from curing one or more plies of a substrate material which has been impregnated with the aforementioned laminating varnish.

Still another aspect of the present invention pertains to a curing agent composition for epoxy resins which comprises a mixture of
(A) a phenolic hydroxyl-containing component consisting essentially of
  (1) from about 7 to about 81 equivalent percent of at least one phenolic hydroxyl-containing compound having an average of more than 1 but not more than 2 phenolic hydroxyl groups per molecule; and (2) from about 93 to about 19 equivalent percent of at least one phenolic hydroxyl-containing compound having an average of more than 2 phenolic hydroxyl groups per molecule;

(B) at least one ketone solvent for component (A) as the only solvent in the composition except for minor amount of any solvent for component (C); and (C) optionally, a catalytic quantity of at least one catalyst for effecting the reaction between an epoxy resin and component (A); and wherein component (B) is present in quantities of from about 5 to about 75 percent by weight based upon the total weight of the composition and component (C) is present in an amount which provides from about zero to about 0.01 mole of component (C) per 100 parts by weight of component (A).

The curable compositions described above cure in less than about 10 minutes at 350° F.

DETAILED DESCRIPTION OF THE INVENTION

The curing agent of the present invention is suitably prepared by melt mixing the components in the absence of a suitable solvent or inert liquid diluent at temperatures of from about 150° C. to about 200° C, suitably from about 175° C. to about 200° C., more suitably from about 175° C. to about 190° C. The curing agent can also be prepared by mixing the components in the presence of a suitable solvent or inert liquid diluent or mixture of inert liquids and/or diluents at temperatures of from about 5° C. to about 80° C., suitably from about 10° C., to about 70° C., more suitably from about 15° C. to about 60° C., more suitably from about 20° C. to about 50° C. Suitable solvents or liquid diluents include, for example, ketones, alcohols, glycol ethers, aromatic hydrocarbons, polar aprotic solvents, combinations thereof and the like. Particularly suitable such solvents or liquid diluents include, for example, acetone, methyl ethyl ketone, ethylene glycol monomethyl ether, propylene glycol monomethyl ether, dimethylformamide, dimethyl sulfoxide, sulfolane, N-methylpyrrolidone, toluene, xylene, combinations thereof and the like.

Any epoxy resin having an average of more than 2 vicinal epoxy groups per molecule can be employed herein. Particularly suitable such resins include, for example, those represented by the formulas I and II

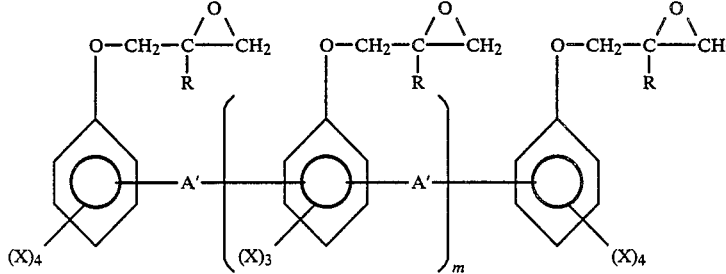

FORMULA I

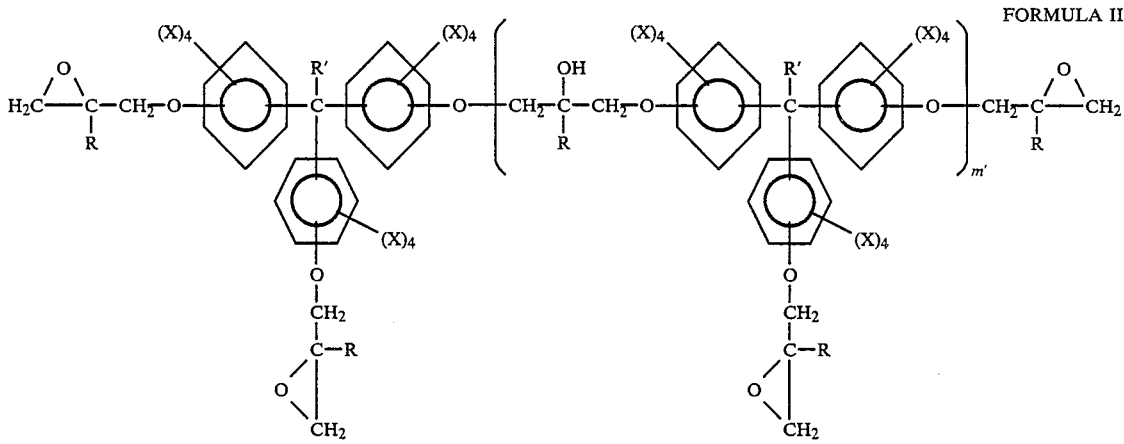

FORMULA II wherein each A' is independently a divalent hydrocarbyl group suitably having from 1 to about 10, more suitably from 1 to about 4, most suitably from 1 to about 2, carbon atoms or a divalent polycyclopentadiene group; each R is independently hydrogen or an alkyl group having from 1 to about 3 carbon atoms; each R' is independently hydrogen or a hydrocarbyl group having suitably from 1 to about 10, more suitably from 1 to about 5, most suitably from 1 to about 2, carbon atoms; each X is independently hydrogen, an alkyl or an alkoxy group having suitably from 1 to about 10, more suitably from 1 to about 5, most suitably from 1 to about 3 carbon atoms or a halogen, preferably chlorine or bromine; m suitably has a value from about 0.1 to about 7, more suitably from about 1 to about 5, most suitably from about 1 to about 4; and m' suitably has a value from zero to about 3, more suitably from zero to about 2, most suitably from zero to about 1.

The phenolic hydroxyl-containing component suitably contains from about 7 to about 81, more suitably from about 30 to about 70, most suitably from about 40 to about 50, equivalent percent phenolic hydroxyl-containing compound having an average of more than 1 but not more than 2 phenolic hydroxyl groups per molecule based upon the combined weight of phenolic hydroxyl-containing compound having an average of not more than 2 phenolic hydroxyl groups per molecule and phenolic hydroxyl-containing compound having an average of more than 2 phenolic hydroxyl groups per molecule. Correspondingly, the phenolic hydroxyl-containing component suitably contains from about 93 to about 19, more suitably from about 70 to about 30, most suitably from about 60 to about 50, equivalent percent phenolic hydroxyl-containing compound having an average of more than 2 phenolic hydroxyl groups per molecule based upon the combined weight of phenolic hydroxyl-containing compound having an average of not more than 2 phenolic hydroxyl groups per molecule and phenolic hydroxyl-containing compound having an average of more than 2 phenolic hydroxyl groups per molecule.

Among the compounds which are suitable as the phenolic hydroxyl-containing compound having an average of more than 1 but not more than 2 phenolic hydroxyl groups per molecule include, for example, those represented by the following formulas III and IV

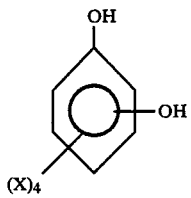

FORMULA III

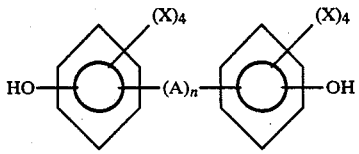

FORMULA IV wherein each A, is independently a divalent hydrocarbyl or a halogen substituted divalent hydrocarbyl group having from 1 to about 12, preferably from 1 to about 6, carbon atoms, —O—, —S—, —S—S—, —SO—, —SO$_2$—, or —CO—; and X and n are as previously defined. Particularly suitable phenolic hydroxyl-containing compounds having an average of more than 1 but not more than 2 phenolic hydroxy groups per molecule include, for example, bisphenol A, bisphenol K, bisphenol F, bisphenol S, the halogenated, particularly the brominated, derivatives of the aforementioned bisphenols wherein the halogen atoms are either ortho or meta with respect to the ether oxygen atoms, resorcinol, catechol, hydroquinone, tetramethylbisphenol A, 4,4'-dihydroxybiphenyl, 3,5,3'5'-tetramethyl-4,4'-dihydroxybiphenyl, 3,5,3'5'-tetrabromidihydroxybiphenyl, 3,5,3'5'-tetramethyl-2,6,2',6'-tetrabromo-4,4'-dihydroxybiphenyl, any combination thereof and the like.

Among the compounds which are suitable as the phenolic hydroxyl-containing component having an average of more than 2 phenolic hydroxyl groups per molecule include, for example, those represented by the following formulas V and VI

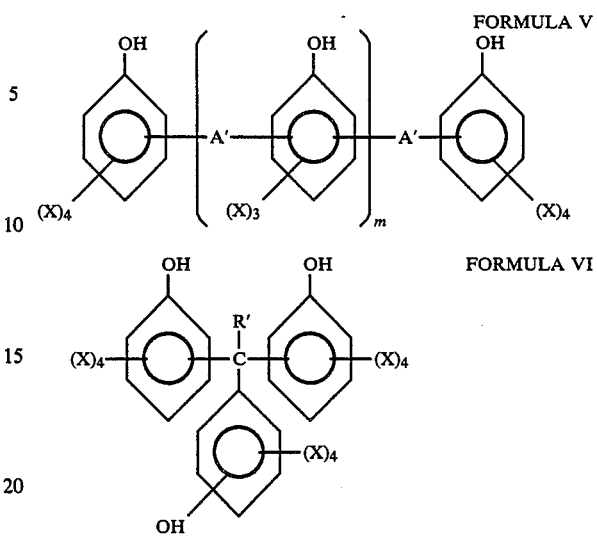

wherein A',R', X and m are as previously defined. Particularly suitable phenolic hydroxy-containing compounds having an average of more than 2 phenolic hydroxyl groups per molecule include, for example, the phenol-formaldehyde novolac resins, cresol-formaldehyde novolac resins, brominated phenol-formaldehyde novolac resins, brominated cresol-formaldehyde novolac resins, 3,3',5,5'-tetramethyl-(1,1',-biphenyl)-2,4,4'-triol, pyrogallol, any combination thereof and the like.

The term hydrocarbyl as employed herein means any aliphatic, cycloaliphatic, aromatic, aryl substituted aliphatic or cycloaliphatic, or aliphatic or cycloaliphatic substituted aromatic groups.

The epoxy-containing component and the phenolic hydroxyl-containing component are employed in quantities which provide a phenolic hydroxyl group to epoxy group ratio suitably of from about 0.75:1 to about 1.5:1, more suitably from about 0.85:1 to about 1.4:1, most suitably from about 0.9:1 to about 1.3:1.

In the compositions containing the multifunctional epoxy resin and the mixture of phenolic hydroxyl containing compounds, the phenolic hydroxyl containing compound having a functionality greater than 1, but not less than 2 is present in amounts which provide a ratio of such phenolic hydroxyl groups to epoxy groups suitably from about 0.1:1 to about 0.65:1, more suitably from 0.2:1 to about 0.6:1, most suitably from about 0.3:1 to about 0.55:1. The remainder amount of phyenolic hydroxyl groups are contributed by the phenolic hydroxyl containing compound having an average of more than 2 phenolic hydroxyl groups per molecule.

Suitable catalysts for effecting the reaction between the epoxy resin and the phenolic hydroxyl-containing compound include, for example, those disclosed in U.S. Pat. Nos. 3,306,872; 3,341,580; 3,379,684; 3,477,990; 3,547,881; 3,637,590; 3,843,605; 3,948,855; 3,956,237; 4,048,141; 4,093,650; 4,131,633; 4,132,706; 4,171,420; 4,177,216; 4,302,574; 4,320,222; 4,358,578; 4,366,295; and 4,389,520, all of which are incorporated herein by reference.

Particularly suitable catalysts are those quaternary phosphonium and ammonium compounds such as, for example, ethyltriphenylphosphonium chloride, ethyltriphenylphosphonium bromide, ethyltriphenylphosphonium iodide, ethyltriphenylphosphonium acetate, ethyltriphenylphosphonium diacetate (ethyltriphenylphosphonium acetate·acetic acid complex), ethyltriphenylphosphonium tetrahaloborate, tetrabutylphosphonium chloride, tetrabutylphosphonium bromide, tetrabutylphosphonium iodide, tetrabutylphosphonium acetate, tetrabutylphosphonium diacetate (tetrabutylphosphonium acetate·acetic acid complex), tetrabutylphosphonium tetrahaloborate, butyltriphenylphosphonium tetrabromobisphenate, butyltriphenylphosphonium bisphenate, butyltriphenylphosphonium bicarbonate, benzyltrimethylammonium chloride, benzyltrimethylammonium hydroxide, benzyltrimethylammonium tetrahalobrate, tetramethylammonium hydroxide, tetrabutylammonium hydroxide, tetrabutylammonium tetrahaloborate, and mixtures thereof and the like.

Other suitable catalysts include tertiary amines such as, for example triethylamine, tripropylamine, tributylamine, benzyldimethylamine, imidazoles such as 2-methylimidazole, mixtures thereof and the like.

Other suitable catalysts include ammonium compounds such as, for example, triethylamine.HCl complex, triethylamine.HBr complex, triethylamine.HI complex, triethylamine.tetrahaloboric acid complex, tributylamine.HCl complex, tributylamine.HBr complex, tributylamine.HI complex, tributylamine.tetrahaloboric acid complex, N,N'-dimethyl-1,2-diaminoethane.tetrahaloboric acid complex, and mixtures thereof and the like.

Other suitable catalysts include quaternary and tertiary ammonium, phosphonium, and arsonium adducts or complexes with suitable non-nucleophilic acids such as, for example, fluoboric, fluoarsenic, fluoatimonic, fluophosphoric, perchloric, perbromic, periodic, mixtures thereof and the like.

The catalysts are employed in any quantity which will promote the reaction between the phenolic hydroxyl-containing compound and the epoxy-containing compound. Usually, a suitable quantity of catalyst is from about zero to about 0.1, more suitably from about 0.00005 to about 0.05, most suitably from about 0.0001 to about 0.03 mole of catalyst per 100 parts by weight of the combined weight of the epoxy-containing component and the phenolic hydroxyl-containing component.

In some instances, in order to prevent premature reaction between the epoxy-containing compounds and the aromatic hydroxyl-containing compounds, it may be desirable to include in the composition one or more stabilizers to prevent this premature reaction from taking place. This is especially true when the compositions are to be subjected to prolonged storage at elevated temperatures.

Suitable stabilizers include, for example, organic and inorganic acids, salts and esters of organic and inorganic acids such as, for example, sulfonic acid, fluoboric acid, perchloric acid, boric acid, chloric acid, bromic acid, iodic acid, nitric acid.

Particularly suitable stabilizers include, for example, p-toluene sulfonic acid, benzene sulfonic acid, methyl p-toluene sulfonate, ammonium perchlorate, fluoboric acid, perchloric acid, nitric acid, mixtures thereof and the like.

These stabilizers when employed, are employed in amounts suitably from about 0.05 to about 1, more suitably from about 0.1 to about 0.8 percent by weight based upon the combined weight of the epoxy-containing component.

In the preparation of laminates from the curable compositions of the present invention, the curable compositions are dissolved into one or more ketone solvents and applied to the substrate material from which the prepreg is to be prepared. Particularly suitable solvents include, for example acetone, methyl ethyl ketone, methyl isobutyl ketone, any combination thereof and the like. The amount of solvent which is employed is that quantity which provides the laminating varnish or other curable composition with the desired application viscosity. Usually, an amount of solvent is suitably from zero to about 75, more suitably from 5 to about 50, most suitably from about 10 to about 35 percent of solvent by weight based upon the total weight of the laminating varnish.

Suitable substrate materials include natural and synthetic fibrous materials in filament, mat, woven or the like form. Suitable fibrous materials include, glass, nylon, orlon, cotton, aramid, graphite, boron, cellulose, polyethylene, polypropylene, and the like.

Also, if desired, the curable compositions of the present invention can also contain pigments, dyes, fillers, surfactants, flow modifiers, any combination thereof and the like. Particularly suitable fillers or pigments or flow modifiers include, for example, titinium dioxide, iron oxide, calcium carbonate, quartz, fused silica, silicates, silanes, metal powders such as, for example, aluminum, iron, magnesium, any combination thereof and the like.

The curable compositions of the present invention are particularly useful in the preparation of laminating varnishes for preparing prepreg materials from which electrical laminates can be prepared. One or more plies of the prepreg material are pressed together while being heated in order to prepare a laminate therefrom. One or more layers of an electrically conductive material is employed as an outer layer of the laminate which can be one of the outer layers of the multiply prepreg materials which is pressed together under heat or the electrically conductive outer layer can be applied later by means of an adhesive. Also, if the electrical conductive layer is employed as one of the plies which is pressed together under heat, there can be, if desired, an adhesive layer placed between it and the prepreg material.

Suitable electrically conductive materials which can be employed herein include, for example the electrically conductive metals such as, aluminum, copper, gold, silver, platinum and the like and the electrically conductive organic polymers such as polyacrylonitrile, which have been carbonized and any combination thereof and the like.

The compositions of the present invention are also suitable for use in fiber reinforced adhesive sheets for the thermal bonding of articles and the like.

The following examples are illustrative of the invention, but are not to be construed as to limiting the scope thereof in any manner.

EXAMPLE 1

(A) Preparation of Laminating Varnish

A solution is prepared by mixing in a suitable vessel at a temperature of 25° C., 120 g (0.441 equiv.) of tetrabromobisphenol A having an equivalent weight of 272, 64 g (0.610 equiv.) of a 5 functional phenol-formaldehyde novolac resin having an equivalent weight of 105, 152 g (0.835 equiv.) of a 3.5 functional phenol-formaldehyde epoxy novolac resin having an EEW of 182, 149.4 g of methyl ethyl ketone, and 1.92 g of a 70 weight percent solution of ethyltriphenylphosphonium acetate-acetic acid complex in methanol. The resultant solution has a solids (non-volatiles) content of 65.7 percent by weight and a Gel time at 344° F. (173.3° C.) of 100 seconds.

(B) Preparation of Prepreg

Strips of fiber glass cloth from Burlington Glass Fabrics designated as style 7628 with an I617 proprietary finish are dipped into the above prepared laminating varnish at a temperature of 25° C. The amount of resin is controlled by passing the strips between glass bars separated by shims. The wet strips are then placed in a forced draft oven to evaporate the solvent and cause thermal advancement of the non-volatile resin components to a B-stage condition. The following conditions are employed:

| | |
|---|---|
| Glass bar separation | 0.017 inch |
| | (0.43 mm) |
| Oven temperature | 350° F. (177° C.) |
| Oven time | 47 sec. |
| Dry resin content | 44.0 wt. % |
| Resin Gel time at 344° F. (173.3° C.) | 33 sec. |

(C) Preparation of Laminates

The above prepreg is pressed into two multi-ply laminates in an electrically heated, hydraulic activated twin platten press. The condition and properties are as follows:

| | Laminate 1 | Laminate 2 |
|---|---|---|
| No. plies | 8 | 8 |
| Temp. of press | 410° F. | 350° F. |
| | (210° C.) | (177° C.) |
| Pressure of press | 330 psi | 350 psi |
| | (2275 kPa) | (2414 kPa) |
| Time in press | 3 min. | 60 min. |
| min. Laminate thickness | 0.040 in. | 0.050 in. |
| | (1.02 mm) | (1.27 mm) |
| Glass transition temp | 139° C. | 140° C. |

The glass transition temperature is determined with a DuPont Differential Scanning Calorimeter at a temperature rise rate of 10° C./min. Laminate 2 is the results obtained when the laminate is cured at the industry standard of 1 hour. As can be seen, the laminate is fully cured in 3 minutes.

COMPARATIVE EXPERIMENT A (A) Preparation of Laminating Varnish

The procedure of Example 1A is followed employing the following components.

224 g (0.439 eq.) of the reaction product of a diglycidyl ether of bisphenol A having an EEW of 182 and tetrabromobisphenol A, the resulting product having an EEW of 510.

6.70 g of dicyandiamide curing agent.

0.26 g of 2-methylimidazole as a curing accelerator at 0.11% of total solids.

118 g of acetone solvent.

30.3 g of dimethylformamide solvent.

32.6 g of propylene glycol methyl ether solvent.

The resultant solution has a solids content of 56.1 percent by weight and a Gel time at 344° F. (173.3° C.) of 204 seconds.

(B) Preparation of Prepreg

The procedure of Example 1B using the following conditions are employed:

| | |
|---|---|
| Glass bar separation | 0.021 inch |
| | (0.533 mm) |
| Oven temperature | 345° F. |
| | (173.9° C.) |
| Oven time | 1 min. 45 sec. |
| Dry resin content | 41.1 wt. % |
| Resin Gel time at 344° F. (173.3° C.) | 108 sec. |

(C) Preparation of Laminates

The above prepreg is pressed into two multi-ply laminates is an electrically heated, hydraulic activated twin platten press. The condition and properties are as follows:

| | Laminate 3 | Laminate 4 |
|---|---|---|
| No. plies | 8 | 8 |
| Temp. of press | 350° F. | 350° F. |
| | (176.7° C.) | (176.7° C.) |
| Pressure of press | 375 psi | 375 psi |
| | 2586 kPa | 2586 kPa |
| Time in press | 4 min. | 60 min. |
| Laminate thickness | 0.040 in. | 0.042 in. |
| | (1.016 mm) | (1.017 mm) |
| Glass transition temp | 95° C. | 123° C. |

This demonstrates that the conventional system is capable of a high degree of cure when pressed for 1 hour, but not when pressed for short periods as evidenced by the low glass transition value at the short press time.

EXAMPLE 2

(A) Preparation of Laminating Varnish

A solution is prepared by mixing in a suitable vessel at a temperature of 25° C. 120 g (0.441 equiv.) of tetrabromobisphenol A having an equivalent weight of 272, 64 g (0.610 equiv.) of a 5 functional phenolformaldehyde novolac resin having an equivalent weight of 105, 170 g (0.85 equiv.) of a 5 functional phenolformaldehyde epoxy novolac resin having an EEW of 200, 195.5 g of methyl ethyl ketone, and 1.52 g of a 70 weight percent solution of ethyltriphenylphosphonium acetate-acetic acid complex in methanol. The resultant solution has a solids (non-volatiles) content of 64.4 percent by weight and a Gel time at 344° F. (b 173.3° C.) of 62 seconds.

(B) Preparation of Prepreg

The procedure of Example 1B using the following conditions are employed:

| | |
|---|---|
| Glass bar separation | 0.018 inch |
| | (0.46 mm) |
| Oven temperature | 350° F. |
| | (177° C.) |
| Oven time | 30 sec. |
| Dry resin content | 41.9 wt. % |
| Resin Gel time at 344° F. (173.3° C.) | 25 sec. |

(C) Preparation of Laminates

The above prepreg is pressed into a multi-ply laminate in an electrically heated, hydraulic activated twin platten press using the procedure described in example 1C. The condition and properties are as follows:

| | Laminate 5 | Laminate 6 |
|---|---|---|
| No. plies | 8 | 8 |
| Temp. of press | 410° F. | 350° F. |

|                     | Laminate 5   | Laminate 6   |
| ------------------- | ------------ | ------------ |
|                     | (210° C.)    | (177° C.)    |
| Pressure of press   | 330 psi      | 350 psi      |
|                     | (2275 kPa)   | (2424 kPa)   |
| Time in press       | 3 min.       | 60 min.      |
| Laminate thickness  | 0.040 in.    | 0.048 in.    |
|                     | (1.016 mm)   | (1.219 mm)   |
| Glass transition temp | 162° C.    | 163° C.      |

EXAMPLE 3

(A) Preparation of Laminating Varnish

A solution is prepared by mixing in a suitable vessel at a temperature of 25° C. 120 g (0.441 equiv.) of tetrabromobisphenol A having an equivalent weight of 272, 64 g (0.610 equiv.) of a 5 functional phenolformaldehyde novolac resin having an equivalent weight of 105, 186.8 g (0.849 equiv.) of an epoxidized reaction product of phenol and hydroxybenzaldehyde (epoxidized trisphenol) having an EEW of 220, 202.7 g of methyl ethyl ketone, and 1.59 g of a 70 weight percent solution of ethyltriphenylphosphonium acetate·acetic acid complex in methanol. The resultant solution has a solids (non-volatiles) content of 64.7 percent by weight and a Gel time at 344° F. (173.3° C.) of 93 seconds.

(B) Preparation of Prepreg

The procedure of Example 1B is using the following conditions are employed:

| Glass bar separation              | 0.018 inch  |
|                                   | (0.46 mm)   |
| Oven temperature                  | 350° F.     |
|                                   | (177° C.)   |
| Oven time                         | 48 sec.     |
| Dry resin content                 | 43.4 wt. %  |
| Resin Gel time at 344° F. (173.3° C.) | 29 sec. |

(C) Preparation of Laminates

The above prepreg is pressed into a multi-ply laminate in an electrically heated, hydraulic activated twin platten press using the procedure described in example 1C. The condition and properties are as follows:

|                     | Laminate 7   | Laminate 8   |
| ------------------- | ------------ | ------------ |
| No. plies           | 8            | 8            |
| Temp. of press      | 410° F.      | 350° F.      |
|                     | (210° C.)    | (177° C.)    |
| Pressure of press   | 330 psi      | 350 psi      |
|                     | (2275 kPa)   | (2424 kPa)   |
| Time in press       | 3 min.       | 60 min.      |
| Laminate thickness  | 0.040 in.    | 0.056 in.    |
|                     | (1.02 mm)    | (1.42 mm)    |
| Glass transition temp | 178° C.    | 186° C.      |

COMPARATIVE EXPERIMENT B (A) Preparation of Laminating Varnish

The procedures and components were identical to hose of Comparative Experiment A.

(B) Preparation of Prepreg

The prepreg is prepared by the procedure of Comparative Experiment A and the following results are obtained.

| Glass bar separation | 0.021 inch  |
|                      | (2.794 mm)  |
| Oven temperature     | 345° F.     |
|                      | (173.9° C.) |
| Oven time            | 105 sec.    |
| Dry resin content    | 41.1 wt. %  |
| Resin Gel time at 344° F. (173.3° C.) | 108 sec. |

(C) Preparation of Laminates

The above prepreg is pressed into a multi-ply laminate in an electrically heated, hydraulic activated twin platten press. The condition and properties are as follows:

|                     | Laminate 9   | Laminate 4*  |
| ------------------- | ------------ | ------------ |
| No. plies           | 8            | 8            |
| Temp. of press      | 410° F.      | 350° F.      |
|                     | (210° C.)    | (176.7° C.)  |
| Pressure of press   | 375 psi      | 375 psi      |
|                     | 2586 kPa     | 2586 kPa     |
| Time in press       | 3 min.       | 60 min.      |
| Laminate thickness  | 0.040 in.    | 0.042 in.    |
|                     | (1.016 mm)   | (1.017 mm)   |
| Glass transition temp | 109° C.    | 123° C.      |

*From Comparative Experiment A.

EXAMPLE 4

To a mixture of 15 g (0.0926 equiv.) of an epoxy resin which is the multiglycidyl ether of the reaction product of salicylaldehyde and phenol having an average epoxide functionality of 3.2 and an EEW of 162 which epoxy resin has been degassed at a temperature of 170° C. and 4.8 g (0.0495 equiv.) of the reaction product of salicylaldehyde and phenol having a average phenolic hydroxyl functionality of 3.2 and an phenolic hydroxyl equivalent weight of 97 which has been degassed at a temperature of 190° C. is added 9 g (0.0331 equiv.) of tetrabromobisphenol A (bromine atoms in the ortho position with respect to the oxygen atoms). The mixture is blended at 170° C. until a solution is developed. To the resulting solution is blended 0.05 g (0.085 millimole) of ethyltriphenylphosphonium acetate·acetic acid complex catalyst as a 70% methanolic solution. The resultant mixture has a melt viscosity of 110 cps at 150° C. The resultant blend is poured into a hot mold which is treated with Fluoroglide mold release. The mold is placed in a 180° C. oven for 1.5 hours and then a 200° C. oven for 1 hour. The properties of the cured casting is as follows: Glass transition temperature of 204° C. as determined by thermomechanical analysis (TMA) and the onset of degradation as measured by thermogravimetric analysis (TGA) is 336° C.

The following components are employed in the following examples.

Epoxy Resin A is the multiglycidyl ether of Phenolic A and has an epoxide equivalent weight (EEW) of about 162 g/eq and an average functionality of about 3.2.

Epoxy Resin B is the product resulting from advancing 1543.1 g (9.525 equiv.) of Epoxy Resin A with 389.9 g (1.433 equiv.) of Phenolic B using 1.114 g (519 ppm) of Catalyst A based on the epoxy weight. The advancement reaction is carried out at 150° C. for 90 minutes. The final product has a bromine content of about 11.3% and an EEW of 218. The resin is then dissolved in 644 g of methyl ethyl ketone (MEK) to make a solution which contains 78% resin.

Epoxy Resin C is the multiglycidyl ether of Phenolic C and has an EEW of 185 and a functionality of about 4.0. The resin is dissolved in MEK at 77.5% solids.

Phenolic A is the reaction product of phenol and salicylaldehyde and has a functionality of about 3.2 and a phenolic equivalent weight of about 97. The phenolic product is dissolved in MEK to make a 70% solids solution.

Phenolic B is tetrabromobisphenol A which has a functionality of 2 and an equivalent weight of 272 g/eq. The bromines are ortho to the hydroxyl group.

Phenolic C is the reaction product of phenol and formaldehyde and has a functionality of about 4.0 and an equivalent weight of about 104 g/eq. The product is dissolved in MEK to make a 70% solids solution.

Catalyst A is a 70% solids solution containing ethyltriphenylphosphonium acetate·acetic acid complex in methanol.

Catalyst B is 2-methylimidazole.

Catalyst C is a 70% solids solution containing tetrabutylphosphonium acetate·acetic acid complex in methanol.

EXAMPLE 5

A. (Preparation of Varnish)

2048 g (7.328 eq.) of Epoxy Resin B is blended with 614 g (2.257 eq.) of Phenolic B and 410 g of MEK. To this solution is added 600 g of Phenolic A (4.330 eq.). This solution is then spiked with 9.22 g of A 5% solution of Catalyst B in dimentylformamide. The final varnish has a No. 2 Zahn cup viscosity of 19 seconds and a gel time at 171° C. of 189 seconds.

B. (Preparation of Prepreg)

The varnish from Example 1A is used to impregnate 7628 "E" glass which has a I617 finish. The treater speed is 11 ft/min. (3352.8 mm/min.) and the 30 foot (9144 mm) heating zone is set at 175° C. The resulting prepreg has a gel time of 174 seconds and a resin content of 46.9%.

C. (Preparation of Laminate)

8 layers of the prepreg from Example 1B is pressed at 500 psi (3447.4 kPa) and 171° C. for 1 hour. The resulting laminate has a Tg as measured by a differential scanning calorimeter of 177° C. The blister resistance of the laminates is measured by exposing the laminates to a pressure cooker with 15 psi (103.4 kPa) steam for 2 hours and then dipping the laminates into a 500° F. solder bath for 20 seconds. 100% of the laminates passed the test showing no sign of blisters on the surface. The laminates are tested for flame resistance using the UL-94 flame test. They are found to have a rating of V-O.

EXAMPLE 6

A. (Preparation of Varnish)

2954 g (12.375 eq.) of Epoxy Resin C solution is blended with 876.2 g (3.221 eq.) of Phenolic B along with 582.8 g of MEK. To this solution is added 1.491 g (10.036 eq.) of Phenolic C solution. To this solution 6.87 g of Catalyst C. The resulting varnish has a gel time at 171° C. of 152 seconds and a No. 2 Zahn cup viscosity of over 40 seconds. An additional 550 g of acetone is added to the varnish to reduce the viscosity to 22 seconds.

B. (Preparation of Prepreg)

Prepreg is made from the varnish in Example 2A as described in Example 1B. The treater speed is 12 ft/min. (3657.6 mm/min.). The resulting prepreg has a gel time of 82 seconds and a resin content of 46.4%.

C. (Preparation of Laminate)

8 ply laminates are made by pressing the above prepreg at 500 psi (3447.4 kPa) and 171° C. for 60 minutes. The resulting laminate has a Tg of 170° C. and passed the blister rest with 83% of the sides. Three 3"×5" (76.2 mm×127 mm) laminate coupons are tested in this experiment and one side is found to blister. Thus, 5 out of 6 sides passed or 83% passed.

EXAMPLES 7–10

Clear castings are made by blending the resin components in an aluminum dish on a 175° C. hot plate until complete solution occurs. The aluminum dishes are then placed in a 200° C. oven for 2 hours. The following table shows the compositions employed along with their cured glass transition temperature, Tg.

|  | Example 7 | Example 8 | Example 9 | Example 10 |
|---|---|---|---|---|
| Epoxy Resin A | 5.119 g (.0316 eq.) | 1.999 g (.0123 eq.) | 2.507 g (.085 eq.) | 5.000 g (.0309 eq.) |
| Phenolic B | 2.218 g (.0082 eq.) | 1.932 g (.0071 eq.) | 0.372 (.00137 eq.) | 3.412 g (.0125 eq.) |
| Phenolic A | 2.197 g (.0226 eq.) | 0.483 g (.00498 eq.) | 1.325 (.0137 eq.) | — |
| Catalyst B | 0.015 g | 0.006 g | 0.006 g | .013 g |
| Phenolic C | — | — | — | 1.619 g (.0156 eq.) |
| Tg | 194° C. | 184° C. | 199° C. | 168° C. |

What is claimed is:

1. A compositon which comprises
   (A) at least one aromatic based epoxy resin having an average number of epoxide groups per molecule of more than 2; and
   (B) a phenolic hydroxyl-containing component consisting essentially of a mixture of
      (1) at least one phenolic hydroxyl-containing compound having an average of not more than 2 phenolic hydroxyl groups per molecule; and
      (2) at least one phenolic hydroxyl-containing compound having an average of more than 2 phenolic hydroxyl groups per molecule;
   (C) optionally, at least one ketone solvent as the only solvent for components (A) and (B); and
   (D) optionally, one or more stabilizers; and
   wherein components (A) and (B) are present in quantities which provide a ratio of phenolic hydroxyl groups for each epoxy group of from about 0.75:1 to about 1.5:1; component (B1) is present in an amount which provides a ratio of phenolic hydroxyl groups per epoxide group contained in component A of from about 0.1:1 to about 0.65:1; (C) is present in an amount of from about zero to about 75 weight percent based upon the combined weight of components (A), (B), (C) and (D); and component (D) is present in an amount of from about zero to about 1 percent by weight based upon the weight of component (A).

2. A composition of claim 1 wherein
   (a) component (B1) is present in an amount which provides a ratio of phenolic hydroxyl groups per epoxide group contained in component A of from about 0.2:1 to about 0.6:1;
   (b) components (A) and (B) are present in quantities which provide a ratio of phenolic hydroxyl groups for each epoxy group of from about 0.85:1 to about 1:4:1; and (c) component (C) is present in an amount of from about 5 to about 50 percent by weight based upon the combined weight of components (A), (B), (C) and (D); and (d) component (D) is present in an amount of from about 0.05 to about 1 percent by weight based upon the weight of component (A).

3. A composition of claim 2 wherein (a) component (B1) is present in an amount which provides a ratio of phenolic hydroxyl groups per epoxide group contained in component A of from about 0.3:1 to about 0.55:1;

(b) components (A) and (B) are present in quantities which provide a ratio of phenolic hydroxyl groups for each epoxy group from about 0.9:1 to about 1.3:1;

(c) component (C) is present in an amount of from about 10 to about 25 percent by weight based upon the combined weight of components (A), (B), (C) and (D); and (d) component (D) is present in an amount of from about 0.1 to about 0.8 percent by weight based upon the weight of component (A).

4. A composition of claim 1, 2 or 3 wherein (a) component A is an epoxy resin represented by the following formulas I or II or a combination of such epoxy resins las III or IV or a combination of such phenolic hydroxyl-containing compounds

FORMULA III

FORMULA IV wherein each A, is independently a divalent hydrocarbyl or a halogen substituted divalent hydrocarbyl group having from 1 to about 12, preferably from 1 to about 6, carbon atoms, —O—, —S—, —S—S—, —SO—, —SO$_2$—, or —CO—; each X is independently hydrogen, an alkyl or an alkoxy group having suitably from 1 to about 10 carbon atoms or a halogen; and n has a value of zero or 1;

(c) component (B-2) is a phenolic hydroxyl-containing compound represented by the following formu-

FORMULA I

FORMULA II wherein each A' is independently a divalent hydrocarbyl group having from 1 to about 10 carbon atoms; each R is as defined above; each R' is independently hydrogen or a hydrocarbyl group having from 1 to about 10 carbon atoms; m has a value from about 0.1 to about 7; and m' has a value from zero to about 3;

(b) component (B-1) is a phenolic hydroxyl-containing compound represented by the following formulas V or VI or a combination of such phenolic hydroxyl-containing compounds

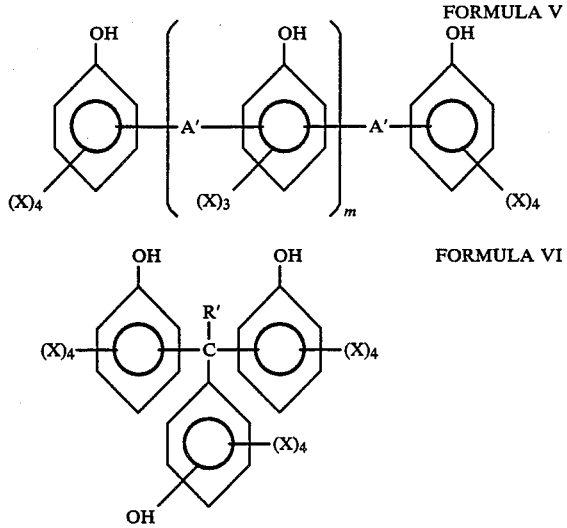

wherein each A', R', X and m are as defined above; and (d) component (D), when present, is selected from the group consisting of organic and inorganic acids, and salts of organic and inorganic acids.

5. A composition of claim 4 wherein
(a) component (A-1) is a diglycidyl ether represented by formula II wherein n has a value of 1 and n' has a value from zero to about 2;
(a) component A is a polyglycidyl ether represented by formula II wherein m has a value from about 1 to about 5
(b) component (B-1) is a phenolic hydroxyl-containing compound represented by formula IV wherein n has a value of 1;
(c) component (B-2) is a phenolic hydroxyl-containing compound represented by formula V wherein m has a value from about 1.01 to about 7; and
(d) component (D) is p-toluene sulfonic acid, benzene sulfonic acid, methyl p-toluene sulfonate, ammonium perchlorate, fluoboric acid, perchloric acid, nitric acid or any combination thereof.

6. A composition of claim 5 wherein
(a) component A-2 is a polyglycidyl ether of a phenol-formaldehyde novolac epoxy resin;
(b) component (B-1) is bisphenol A or tetrabromo bisphenol A;
(c) component (B-2) is a phenol-formaldehyde novolac resin;
(d) component (C) is acetone; and
(e) component (D) is p-toluene sulfonic acid, benzene sulfonic acid, or methyl p-toluene sulfonate.

7. A curable composition which comprises
(A) at least one aromatic based epoxy resin having an average number of epoxide groups per molecule of more than 2;
(B) a phenolic hydroxyl-containing component consisting essentially of a mixture of
(1) at least one phenolic hydroxyl-containing compound having an average of not more than 2 phenolic hydroxyl groups per molecule; and
(2) at least one phenolic hydroxyl-containing compound having an average of more than 2 phenolic hydroxyl groups per molecule;

(c) optionally, at least one ketone solvent for component (A) as the only solvent in the composition except for minor amounts of any solvent for component (C);
(D) optionally, one or more stabilizers; and
(D) a catalytic quantity of at least one catalyst for effecting the reaction between components (A) and (B); and
wherein components (A) and (B) are present in quantities which provide a ratio of phenolic hydroxyl groups for each epoxy group of from about 0.75:1 to about 1.5:1; component (B1) is present in an amount which provides a ratio of phenolic hydroxyl groups per epoxide group contained in component A of from about 0.1:1 to about 0.65:1; component (C) is present in an amount of from about zero to about 75 weight percent based upon the combined weight of components (A), (B), (C), (D) and (E); component (D) is present in an amount of from about zero to about 1 percent by weight based upon the weight of component (A) and component (E) is present in an amount of from about 0.00005 to about 0.01 mole of catalyst per 100 parts by weight of the combined weight of component (A) and component (B).

8. A curable composition of claim 7 wherein
(a) component (B1) is present in an amount which provides a ratio of phenolic hydroxyl groups per epoxide group contained in component A of from about 0.2:1 to about 0.6:1;
(b) components (A) and (B) are present in quantities which provide a ratio of phenolic hydroxyl groups for each epoxy group of from about 0.85:1 to about 1.4:1;
(c) component (C) is present in an amount of from about zero to about 50 weight percent based upon the combined weight of components (A), (B), (C), (D) and (E);
(d) component (D) is present in an amount of from about 0.05 to about 1 percent by weight based upon the weight of component (A); and
(e) component (E) is present in an amount of from about 0.00005 to about 0.05 mole per 100 parts by weight of the combined weight of component (A) and component (B).

9. A curable composition of claim 8 wherein
(a) component (B1) is present in an amount which provides a ratio of phenolic hydroxyl groups per epoxide group contained in component A of from about 0.3:1 to about 0.55:1;
(b) components (A) and (B) are present in quantities which provide a ratio of phenolic hydroxyl groups for each epoxy group of from about 0.9:1 to about 1.3:1;
(c) component (C) is present in an amount of from about zero to about 25 weight percent based upon the combined weight of components (A), (B), (C), (D) and (E);
(d) component (D) is present in an amount of from about 0.0.1 to about 0.8 percent by weight based upon the weight of component (A); and
(e) component (E) is present in an amount of from about 0.0001 to about 0.03 mole per 100 parts by weight of the combined weight of component (A) and component (B).

10. A curable composition of claim 7, 8 or 9 wherein
(a) A-2 is an epoxy resin represented by the following formulas I or II or a combination of such epoxy resins

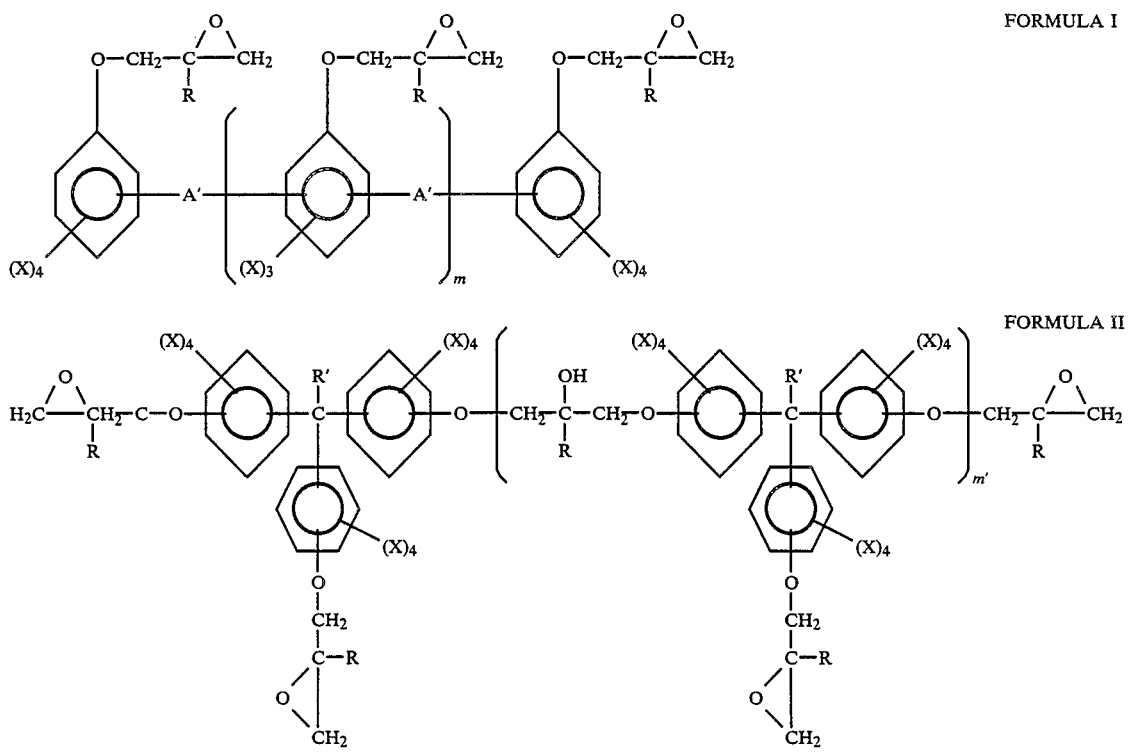

FORMULA I

FORMULA II wherein each A' is independently a divalent hydrocarbyl group having from 1 to about 10 carbon atoms; each R is as defined above; each R' is independently hydrogen or a hydrocarbyl group having from 1 to about 10 carbon atoms; m has a value from about 0.1 to about 7; and m' has a value from zero to about 3;

(b) component (B-1) is a phenolic hydroxyl-containing compound represented by the following formulas III or IV or a combination of such phenolic hydroxyl-containing compounds

FORMULA III

FORMULA IV wherein each A, is independently a divalent hydrocarbyl or a halogen substituted divalent hydrocarbyl group having from 1 to about 12, preferably from 1 to about 6, carbon atoms —O—, —S—, —S—S—, —SO—, —SO$_2$—, or —CO—; each X is independently hydrogen, an alkyl or an alkoxy group having suitably from 1 to about 10 carbon atoms or a halogen; and n has a value of zero or 1;

(c) component (B-2) is a phenolic hydroxyl-containing compound represented by the following formulas V or VI or a combination of such phenolic hydroxyl-containing compounds

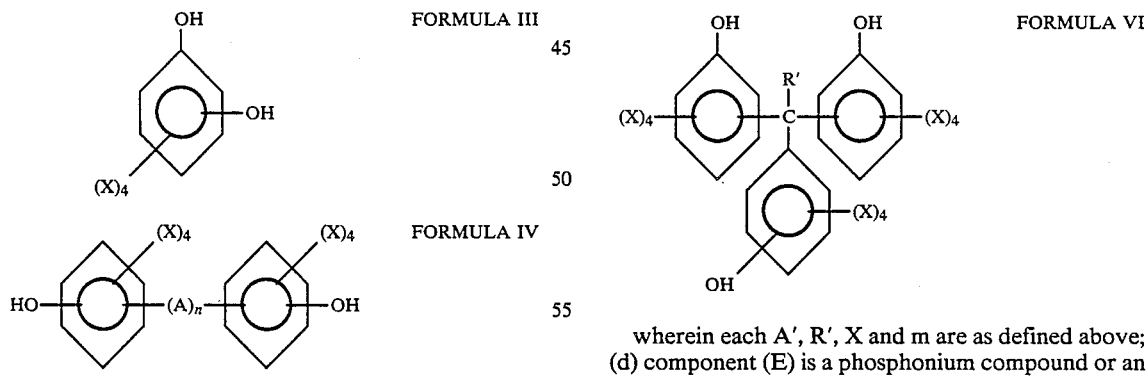

FORMULA V

FORMULA VI wherein each A', R', X and m are as defined above;

(d) component (E) is a phosphonium compound or an imidazole.

11. A curable composition of claim 10 wherein
(a) component A is a polyglycidyl ether represented by formula I wherein m has a value from about 1 to about 5;
(b) component (B-1) is a phenolic hydroxyl-containing compound represented by formula III wherein n has a value of 1;
(c) component (B-2) is a phenolic hydroxyl-containing compound represented by formula V wherein m has a value from about 1.01 to about 7;

(d) component (D) is selected from the group consisting of organic and inorganic acids, salts of inorganic acids; esters of organic acids; and any combination thereof; and (e) component (E) is selected from the group consisting of phosphonium compounds, ammonium compounds, imidazoles and any combination thereof.

12. A curable composition of claim 11 wherein (a) component A is a polyglycidyl ether of a phenol-formaldehyde novoalc epoxy resin;

(b) component (B-1) is bisphenol A or tetrabromo bisphenol A;

(c) component (B-2) is a phenol-formaldehyde novolac resin;

(d) component (C) is acetone;

(e) component (D) is p-toluene sulfonic acid, benzene sulfonic acid, methyl p-toluene sulfonate or any combination thereof; and (f) component (E) is a quaternary phosphonium halide, a quaternary phosphonium acetate·acetic acid complex, 2-methylimidazole, the reaction product of a quaternary phosphonium acetate·acetic acid complex and fluoboric acid in a respective molar ratio of from about 1:0.9 to about 1:1.25, or any combination thereof.

13. In a laminating varnish comprising (A) an epoxy resin component, (B) a curing agent from said epoxy resin and (C) a solvent; the improvement which comprises employing as the epoxy resin, component (A), at least one aromatic based epoxy resin having an average number of epoxide groups per molecule of more than 2; employing as said curing agent, component (B), a phenolic hydroxyl-containing composition consisting essentially of a mixture of (1) at least one phenolic hydroxyl-containing compound having an average of more than 1 but not more than 2 phenolic hydroxyl groups per molecule; and (2) at least one phenolic hydroxyl-containing compound having an average of more than 2 phenolic hydroxyl groups per molecule; employing as the solvent, component (C), at least one ketone solvent as the only solvent present in the composition except for minor amounts of any solvent for component (D); and optionally, (D) a catalytic quantity of at least one catalyst for effecting the reaction between components (A) and (B); and wherein components (A) and (B) are present in quantities which provide a ratio of phenolic hydroxyl groups for each epoxy group of from about 0.75:1 to about 1.5:1; component (B1) is present in an amount which provides a ratio of phenolic hydroxyl groups per epoxide group contained in component A of from about 0.1:1 to about 0.65:1; and component (C) is present in an amount of from about 5 to about 75 percent by weight based upon the total weight of the varnish composition; and component (D) is present in an amount which provides from about zero to about 0.01 moles of component (D) per 100 parts by weight of the combined weight of component (A) and component (B).

14. A laminating varnish of claim 13 wherein (a) component (B1) is present in an amount which provides a ratio of phenolic hydroxyl groups per epoxide group contained in component A of from about 0.2:1 to about 0.6:1;

(b) components (A) and (B) are present in quantities which provide a ratio of phenolic hydroxyl groups for each epoxy group of from about 0.85:1 to about 1.4:1;

(c) component (C) is present in an amount of from about 5 to about 50 percent by weight based upon the total weight of the varnish composition; and (d) component (D) is present in an amount of from about 0.00005 to about 0.01 mole of catalyst per 100 parts by weight of the combined weight of component (A) and component (B).

15. A laminating varnish of claim 14 wherein (a) component (B1) is present in an amount which provides a ratio of phenolic hydroxyl groups per epoxide group contained in component (A) of from about 0.3:1 to about 0.55:1;

(b) components (A) and (B) are present in quantities which provide a ratio of phenolic hydroxyl groups for each epoxy group of from about 0.9:1 to about 1.3:1;

(c) component (C) is present in an amount of from about 10 to about 25 percent by weight based upon the total weight of the varnish composition; and (d) component (D) is present in an amount of from about 0.0001 to about 0.03 mole of catalyst per 100 parts by weight of the combined weight of component (A) and component (B).

16. A laminating varnish of claim 13, 14 or 15 wherein (a) component A-2 is an epoxy resin represented by the following formulas I or II or a combination of such epoxy resins

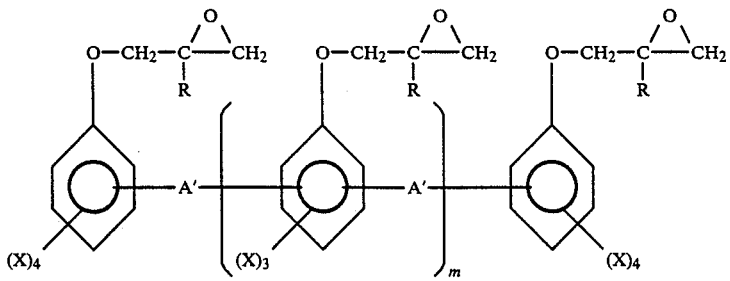

FORMULA I

-continued

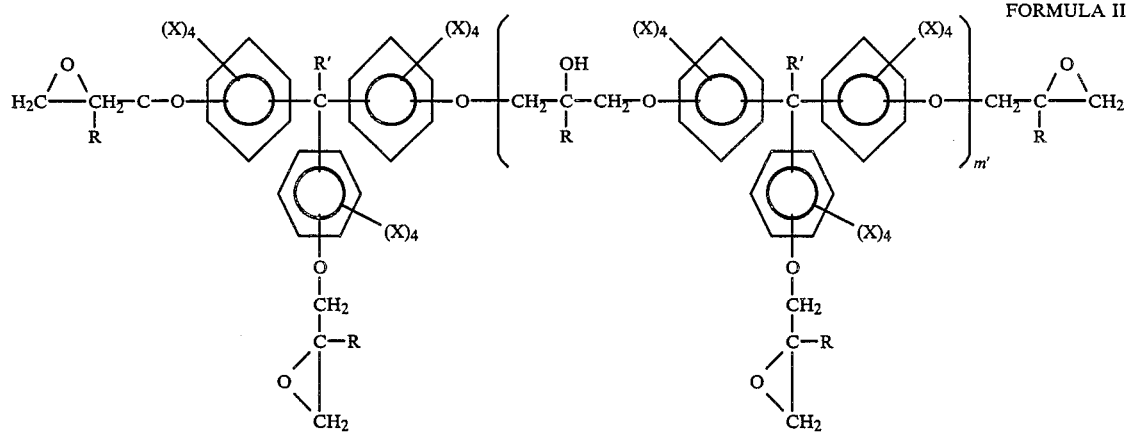

FORMULA II wherein each A' is independently a divalent hydrocarbyl group having from 1 to about 10 carbon atoms; each R is as defined above; each R' is independently hydrogen or a hydrocarbyl group having from 1 to about 10 carbon atoms; m has a value from about 0.1 to about 7; and m' has a value from zero to about 3;

(b) component (B-1) is a phenolic hydroxyl-containing compound represented by the following formulas III or IV or a combination of such phenolic hydroxyl-containing compounds

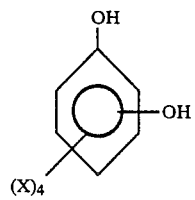

FORMULA III

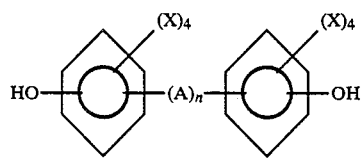

FORMULA IV wherein each A, is independently a divalent hydrocarbyl or a halogen substituted divalent hydrocarbyl group having from 1 to about 12, preferably from 1 to about 6, carbon atoms, —O—, —S—, —S—S—, —SO—, —SO$_2$—, or —CO—; each X is independently hydrogen, an alkyl or an alkoxy group having suitably from 1 to about 10 carbon atoms or a halogen; and n has value of zero or 1;

(c) component (B-2) is a phenolic hydroxyl-containing compound represented by the following formulas V or VI or a combination of such phenolic hydroxyl-containing compounds

FORMULA V

FORMULA VI wherein each A', R', and X and m are as defined above; and (d) component (D) is a phosphonium compound, an ammonium compound or an imidazole.

17. A laminating varnish of claim 16 wherein
   (a) component A is a polyglycidyl ether represented by formula I wherein m has a value from about 1 to about 5;
   (b) component (B-1) is a phenolic hydroxyl-containing compound represented by formula IV wherein n has a value of 1; and
   (c) component (B-2) is a phenolic hydroxyl-containing compound represented by formula V wherein m has a value from about 1.01 to about 7.

18. A laminating varnish of claim 17 wherein component A is a polyglycidyl ether of a phenol-formaldehyde novolac epoxy resin;
   (B) component (B-1) is bisphenol A or tetrabromo bisphenol A;
   (c) component (B-2) is a phenol-formaldehyde novolac resin;
   (d) component (C) is acetone; and
   (e) component (D) is a quaternary phosphonium halide, a quaternary phosphonium acetate·acetic acid complex, an imidazole, the reaction product of a quaternary phosphonium acetate·acetic acid complex and fluoboric acid in a respective molar ratio of from about 1:0.9 to about 1:1.25, or any combination thereof.

19. A substrate impregnated with a laminating varnish of claims 13, 14, or 15.

20. A substrate impregnated with a laminating varnish of claim 16.

21. A substrate impregnated with a laminating varnish of claim 17.

22. A substrate impregnated with a laminating varnish of claim 18.

23. A laminate resulting from curing one or more plies of a substrate of claim 19.

24. A laminate of claim 23 which has an outer layer of an electrical conducting material.

25. A laminate of claim 24 wherein the electrical conducting material is copper.

26. A laminate resulting from curing one or more plies of a substrate of claim 20.

27. A laminate of claim 26 which has an outer layer of an electrical conducting material.

28. A laminate of claim 27 wherein the electrical conducting material is copper.

29. A laminate resulting from curing one or more plies of a substrate of claim 21.

30. A laminate of claim 29 which has an outer layer of an electrical conducting material.

31. A laminate of claim 30 wherein the electrical conducting material is copper.

32. A laminate resulting from curing one or more plies of a substrate of claim 22.

33. A laminate of claim 32 which has an outer layer of an electrical conducting material.

34. A laminate of claim 33 wherein the electrical conducting material is copper.

35. The product resulting from curing the curable composition of claim 7, 8, or 9.

36. The product resulting from curing the curable composition of claim 10.

37. The product resulting from curing the curable composition of claim 11.

38. The product resulting from curing the curable composition of claim 12.

39. A curing agent composition for epoxy resins which comprises a mixture of
(A) a phenolic hydroxyl-containing component consisting essentially of a mixture of
  (1) from about 7 to about 81 equivalent percent of at least one phenolic hydroxyl-containing compound having an average of more than 1 but not more than 2 phenolic hydroxyl groups per molecule; and
  (2) from about 93 to about 19 equivalent percent of at least one phenolic hydroxyl-containing compound having an average of more than 2 phenolic hydroxyl groups per molecule;
(B) at least one ketone solvent for component
  (A) as the only solvent in the composition except for minor amounts of any solvent for component (C); and
(C) optionally, a catalytic quantity of at least one catalyst for effecting the reaction between an epoxy resin and component (A); and
wherein component (B) is present in quantities of from about 5 to about 75 percent by weight based upon the total weight of the curing agent composition.

40. A curing agent composition of claim 39 wherein (a) component (A) comprises from about 30 to about 70 equivalent percent of component (1) and from about 70 to about 30 equivalent percent of component (2); and (b) component (B) is present in an amount of from about 5 to about 50 weight percent based upon the total weight of the curing agent composition.

41. A curing agent composition of claim 40 wherein (a) component (a) comprises from about 40 to about 50 equivalent percent of component (1) and from about 60 to about 50 equivalent percent of component (2); and (b) component (B) is present in an amount of from about 10 to about 25 percent by weight based upon the total weight of the curing agent composition.

42. A curing agent compositon of claim 39, 40 or 41 wherein (a) component (A-1) is a phenolic hydroxyl-containing compound represented by the following formulas III or IV or a combination of such phenolic hydroxyl-containing compounds

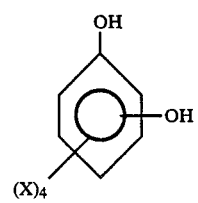

FORMULA III

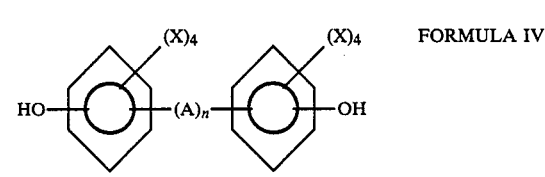

FORMULA IV wherein each A, is independently a divalent hydrocarbyl or a halogen substituted divalent hydrocarbyl group having from 1 to about 12, preferably from 1 to about 6, carbon atoms, —O—, —S—, —S—S—, —SO—, —SO₂—, or —CO—; each X is independently hydrogen, an alkyl or an alkoxyl group having suitably from 1 to about 10 carbon atoms or a halogen; and n has a value of zero or 1;

(b) component (A-2) is a phenolic hydroxyl-containing compound represented by the following formulas V or VI or a combination of such phenolic hydroxyl-containing compounds

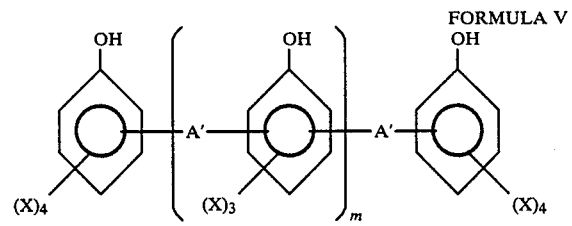

FORMULA V

-continued

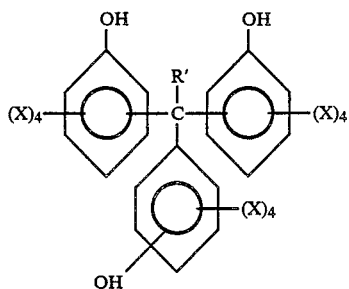

FORMULA VI wherein each A' is independently a divalent hydrocarbyl group having from 1 to about 10 carbon atoms; each R is as defined above; each R' is independently hydrogen or a hydrocarbyl group having from 1 to about 10 carbon atoms; and m has a value from about 0.1 to about 7; and (c) component (C) is a phosphonium compound, an ammonium compound or an imidazole.

43. A curing agent composition of claim 42 wherein
(a) component (A-1) is a phenolic hydroxyl-containing compound represented by formula IV wherein n has a value of 1; and
(b) component (A-2) is a phenolic hydroxyl-containing compound represented by formula V wherein m has a value from about 1.01 to about 7.

44. A curing agent composition of claim 43 wherein
(a) component (A-1) is bisphenol A or tetrabromo bisphenol A;
(b) component (A-2) is a phenol-formaldehyde novolac resin;
(c) component (B) is acetone; and
(d) component (C) is a quaternary phosphonium halide, a quaternary phosphonium acetate-acetic acid complex, an imidazole, the reaction product of a quaternary phosphonium acetate-acetic acid complex and fluoboric acid in a respective molar ratio of from about 1:0.9 to about 1:1.25, or any combination thereof.

* * * * *

UNITED STATES PATENT AND TRADEMARK OFFICE
CERTIFICATE OF CORRECTION

PATENT NO. : 4,874,669

DATED : October 17, 1989

INVENTOR(S) : PAUL A. LARSON, et al.

It is certified that error appears in the above-identified patent and that said Letters Patent is hereby corrected as shown below:

Column 1, line 21 and 22; delete "It would be desirable to obtain an adequate cure."

Column 1, line 63; return after "more than 2;" "(B)" should be at the left margin.

Column 2, line 44; change "minor amount," to read --minor amounts--

Column 3, line 9; change "amount of" to read --amounts of--.

Column 3, line 65; change "more suitably" to read --most suitably--.

Column 6, line 51; change "phyenolic" to read --phenolic--.

Column 7, line 13; change "tetrahalobrate," to read --tetrahaloborate,--.

Column 11, line 60; change "hose of" to read --those of--.

Column 14, line 7; change "rest" to read --test--.

Column 15, line 2; change "1:4:1;" to read --1.4:1;--.

Column 15, line 17; change "group from" to read --group of from--.

Column 18, line 6; change "(D) a catalytic" to read --(E) a catalytic--.

Column 21, line 10; change "novoalc" to read --novolac--.

Column 21, line 27; change "agent from" to read --agent for--.

UNITED STATES PATENT AND TRADEMARK OFFICE
CERTIFICATE OF CORRECTION

PATENT NO. : 4,874,669

DATED : October 17, 1989

INVENTOR(S) : Paul A. Larson, et al.

It is certified that error appears in the above-identified patent and that said Letters Patent is hereby corrected as shown below:

Column 23, line 31; change "from -b 1" to read --from 1--.

Column 24, line 43; change "and X" to read --X--.

Column 24; line 57; change "wherein compo-" to read --wherein (a) compo---.

Column 24, line 60; change "(B) component" to read --(b) component--.

Column 26, line 50; change "an alkoxyl" to read --an alkoxy--.

Signed and Sealed this

Eleventh Day of June, 1991

*Attest:*

HARRY F. MANBECK, JR.

*Attesting Officer*  *Commissioner of Patents and Trademarks*